(12) United States Patent
Chen

(10) Patent No.: US 7,594,198 B2
(45) Date of Patent: Sep. 22, 2009

(54) ULTRA FINE PITCH I/O DESIGN FOR MICROCHIPS

(75) Inventor: Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 114 days.

(21) Appl. No.: 11/711,949

(22) Filed: Feb. 27, 2007

(65) Prior Publication Data

US 2008/0204113 A1    Aug. 28, 2008

(51) Int. Cl.
*G06F 17/50*    (2006.01)

(52) U.S. Cl. .......................................................... 716/1
(58) Field of Classification Search ...................... 716/1; 257/106, 355
See application file for complete search history.

(56) References Cited

U.S. PATENT DOCUMENTS

| | | | | |
|---|---|---|---|---|
| 5,760,428 | A * | 6/1998 | Colwell et al. | 257/206 |
| 5,903,019 | A * | 5/1999 | Watanabe | 257/208 |
| 6,849,902 | B1 * | 2/2005 | Lin | 257/355 |
| 2004/0150459 | A1 * | 8/2004 | Muto et al. | 327/410 |
| 2004/0188763 | A1 * | 9/2004 | Taniguchi et al. | 257/355 |
| 2005/0275027 | A1 * | 12/2005 | Mallikarjunaswamy | 257/355 |
| 2007/0111376 | A1 * | 5/2007 | Pendse | 438/106 |

* cited by examiner

*Primary Examiner*—Jack Chiang
*Assistant Examiner*—Suchin Parihar
(74) *Attorney, Agent, or Firm*—K&L Gates LLP

(57) ABSTRACT

A microchip includes at least one I/O area surrounding at least one core circuit area. The I/O area further includes a first I/O cell having at least one first post-driver device connected to a first I/O pad; a second I/O cell having at least one second post-driver device connected to a second I/O pad; and an electrostatic discharge (ESD) cluster shared by the first I/O cell and the second I/O cell for protecting the same against ESD current during an ESD event, thereby reducing a total width of the first I/O cell and the second I/O cell.

20 Claims, 6 Drawing Sheets

ULTRA FINE PITCH I/O DESIGN FOR MICROCHIPS

BACKGROUND

The present invention relates generally to integrated circuits, and more particularly to an ultra fine pitch I/O designs for microchips.

Advancement of semiconductor processing technology has caused devices implemented in core circuit areas of a microchip to shrink in size. It is estimated that the core circuit area of a particular integrated circuit is reduced by one half as the technology evolves from one generation to the next. Referring to FIG. 1, a floor plan 100 of a microchip manufactured with 90 nm semiconductor processing technology is shown to have a core circuit area 102 where a large number of core devices are implemented and an I/O area 104 where a plurality of I/O devices are disposed. A floor plan 110 of a microchip manufactured with 65 nm technology has a core circuit area 112 and an I/O area 114, and a floor plan 120 of a microchip manufactured with 45 nm technology has a core circuit area 122 and an I/O area 124. These three floor plans 100, 110 and 120 are deigned for implementing the same circuit schematics on semiconductors with various generations of semiconductor processing technology. As shown in the drawing, the core circuit area 112 is about half the size of the core circuit area 102, and the area 122 is about half the size of the area 112.

Although the core circuit areas 102, 112, and 122 continue to shrink in size as the technology evolves, the I/O areas 104, 114 and 124 remain in about the same size, and therefore become the bottleneck for further reducing the size of microchips. One of the reasons that the I/O areas 104, 114 and 124 cannot be further reduced in size is that the pin count of a particular microchip remains unchanged regardless generations of technology. Another reason is that narrowing the width of the I/O areas 104, 114 and 124 can cause the I/O devices to be ineffective in functioning as electrostatic discharge (ESD) protection mechanism. For example, FIG. 2A illustrates three I/O cells 202, 204 and 206 arranged adjacent to each other, forming part of an I/O ring surrounding a core circuit area. Each cell 202, 204 or 206 includes a post-driver NMOS transistor area 208, a post-driver PMOS transistor area 210 and a pre-driver area 212, wherein devices implemented in these areas 208, 210 can function as ESD protection device during an ESD event. FIG. 3A illustrates a cross-sectional view 214 of the devices in the post-driver NMOS transistor area 208 where they function as ESD protection devices. In order for these ESD protection devices to provide a threshold voltage that distinguishes a normal operation state from an ESD protection state, the width D1 of the substrate underlying the polysilicon gates 216 and between ESD pickup contacts 218 needs to be sufficient in order to provide enough substrate resistance. FIG. 2B shows a layout view of narrowed I/O cells 220, 224, 226, and FIG. 3B shows a cross-sectional view 240 of devices in a post-driver NMOS transistor area 230 in the I/O cell 220. The width D2 of the substrate underlying polysilicon gates 232 and between ESD pick-up contacts 244 is much narrower than D1 shown in FIG. 2A. As a result, this causes insufficient substrate resistance, such that the devices in the post-driver NMOS transistor area 230 cannot function properly as ESD protection devices during an ESD event.

FIG. 4 illustrates another conventional deign that splits I/O cells into two rows 402 and 404 in order to reduce the overall size of the I/O area. However, such design may cause unexpected ESD issues between the two rows of I/O cells, require complex routing of conductive lines, and may not be suitable for ball grid array (BGA) packaging.

As such, what is needed is a layout design for I/O areas with reduced size in order to allow microchips for further shrinkage as semiconductor processing technology advances.

SUMMARY

The present invention discloses a microchip having at least one I/O area surrounding at least one core circuit area. In one embodiment of the present invention, the I/O area includes a first I/O cell having at least one first post-driver device connected to a first I/O pad; a second I/O cell having at least one second post-driver device connected to a second I/O pad; and an electrostatic discharge (ESD) cluster shared by the first I/O cell and the second I/O cell for protecting the same against ESD current during an ESD event, thereby reducing a total width of the first I/O cell and the second I/O cell.

The construction and method of operation of the invention, however, together with additional objectives and advantages thereof will be best understood from the following description of specific embodiments when read in connection with the accompanying drawings.

DESCRIPTION

This invention describes an I/O cell design that makes possible an ultra fine cell pitch in accommodation to continuous shrinkage of core circuit areas of microchips as semiconductor processing technology advances. The following merely illustrates various embodiments of the present invention for purposes of explaining the principles thereof. It is understood that those skilled in the art of integrated circuit deign and semiconductor manufacturing will be able to devise various equivalents that, although not explicitly described herein, embody the principles of this invention.

Figure 5:
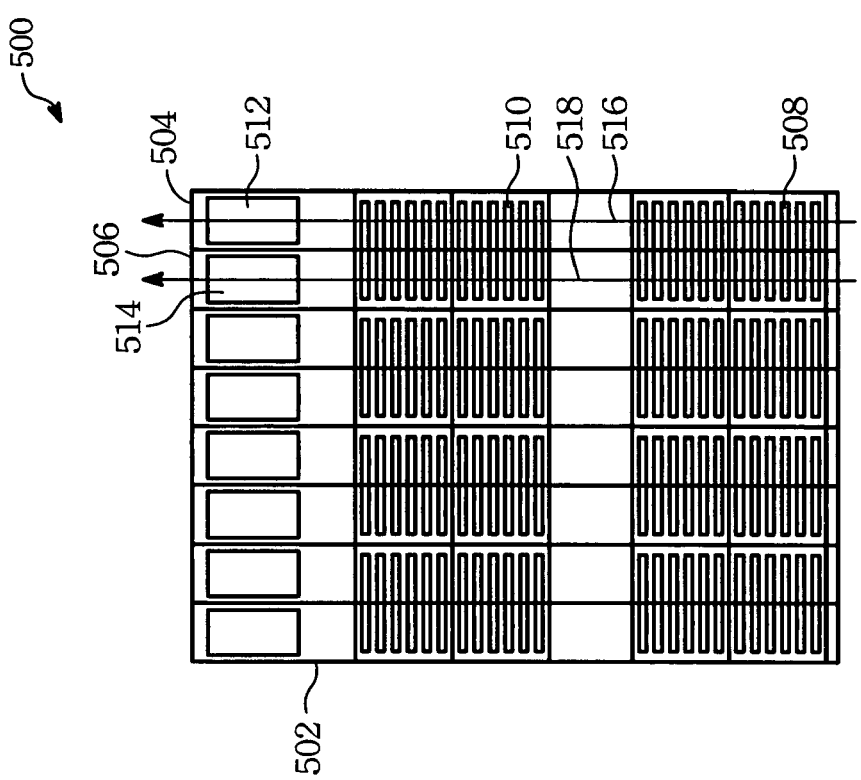
FIG. 5 illustrates a layout design of I/O cells in accordance with one embodiment of the present invention.

FIG. 5 partially illustrates a layout design 500 of an I/O ring comprised of a plurality of I/O cells in accordance with one embodiment of the present invention. The pitch of each I/O cell is virtually defined by an elongated rectangle, such as 504 shown in the drawing. The pitch, however, does not necessarily represent the exact physical location where the I/O cell is implemented. Two or more neighboring I/O cells can share at least one common post-driver device area. In this exemplary embodiment, two neighboring I/O cells 504 and 506 share a common post-driver NMOS transistor area 508 and a common post-driver PMOS transistor area 510, and have separate pre-driver device areas 512 and 514. A number of NMOS transistors and PMOS transistors are constructed in the post-driver NMOS transistor area 508 and the post-driver PMOS transistor area 510, respectively. A first conductive line 516 overlying the I/O cell 504 selectively connects some of the NMOS transistors disposed in the post-driver NMOS transistor area 508 to a first I/O pad (not shown in this figure), and a second conductive line 518 overlying the I/O cell 506 connects the rest of the NMOS transistors in the area 508 to a second I/O pad (not shown in this figure) that functions separately from the first I/O pad. Similarly, the first conductive line 516 selectively connects some of the PMOS transistors disposed in the post-driver PMOS transistor area 510 to the first I/O pad, and the second conductive line 518 connects the rest of the PMOS transistors in the area 510 to the second I/O pad.

Figure 1:
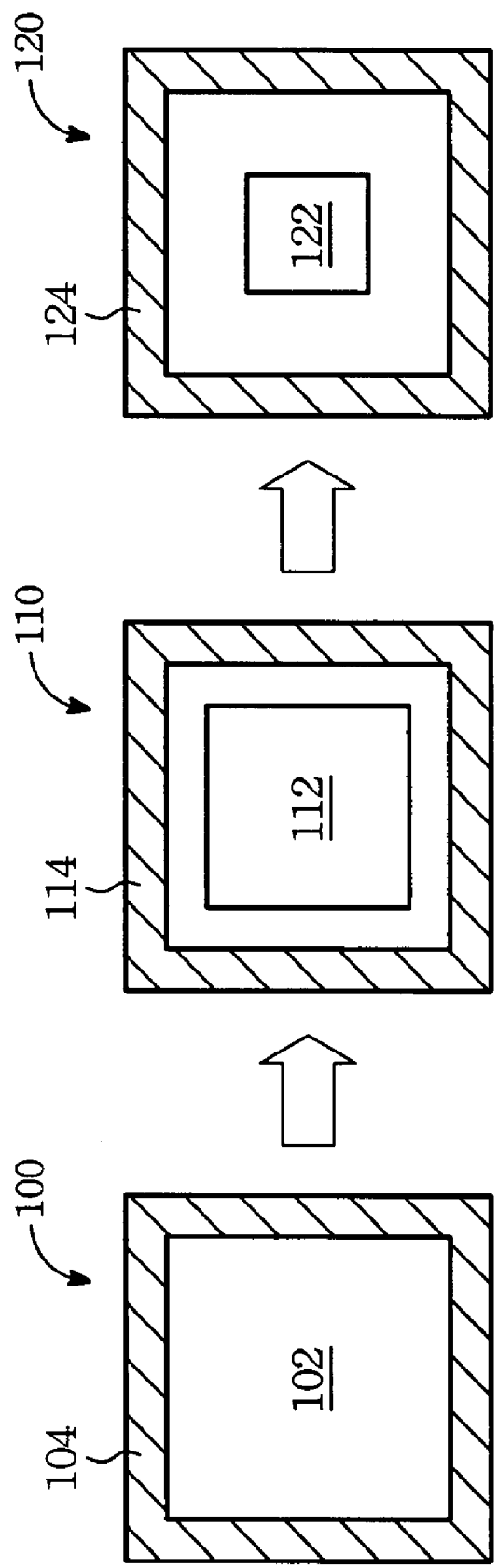
FIG. 1 illustrates several floor plans of a microchip manufactured based on various generations of technology.
Figure 2B:
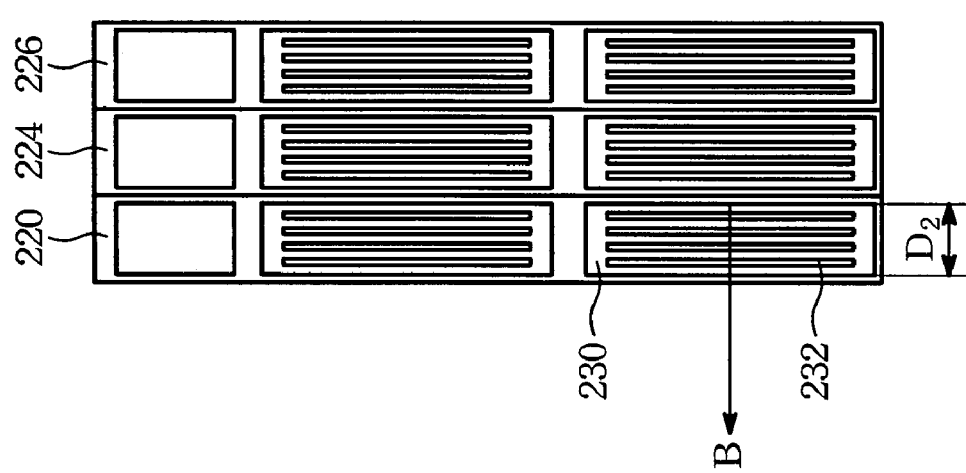
FIGS. 2A and 2B illustrate layout designs of conventional I/O cells in a microchip.
Figure 2A:
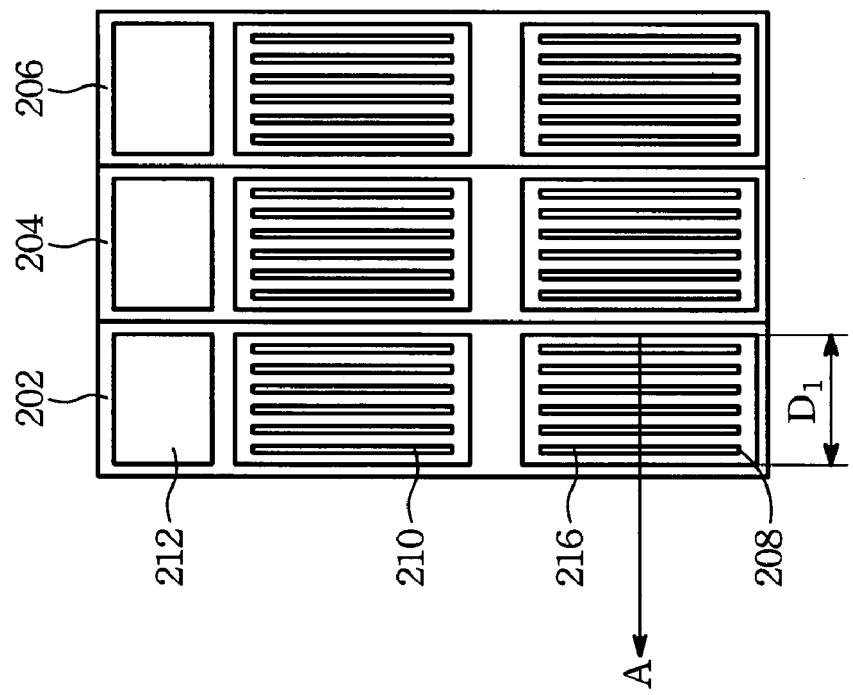
Figure 3B:
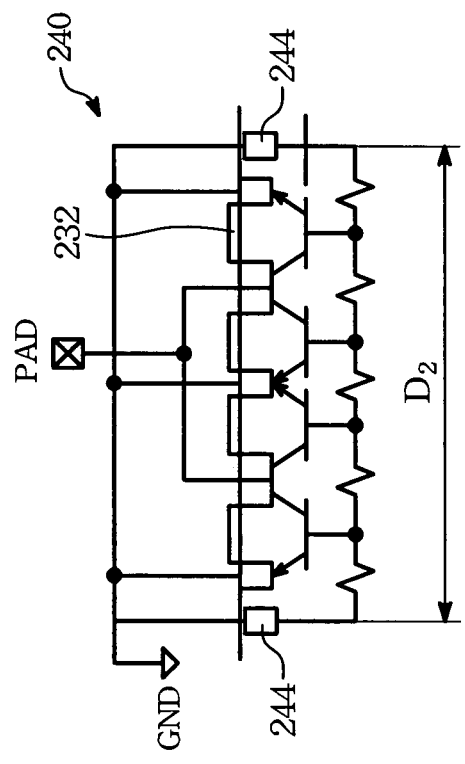
FIGS. 3A and 3B illustrate cross-sectional views of conventional I/O cells in a microchip.
Figure 3A:
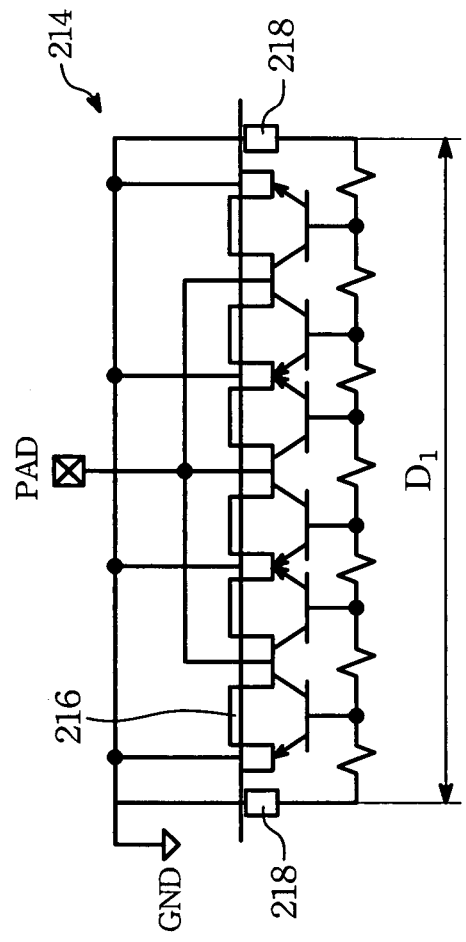
Figure 4:
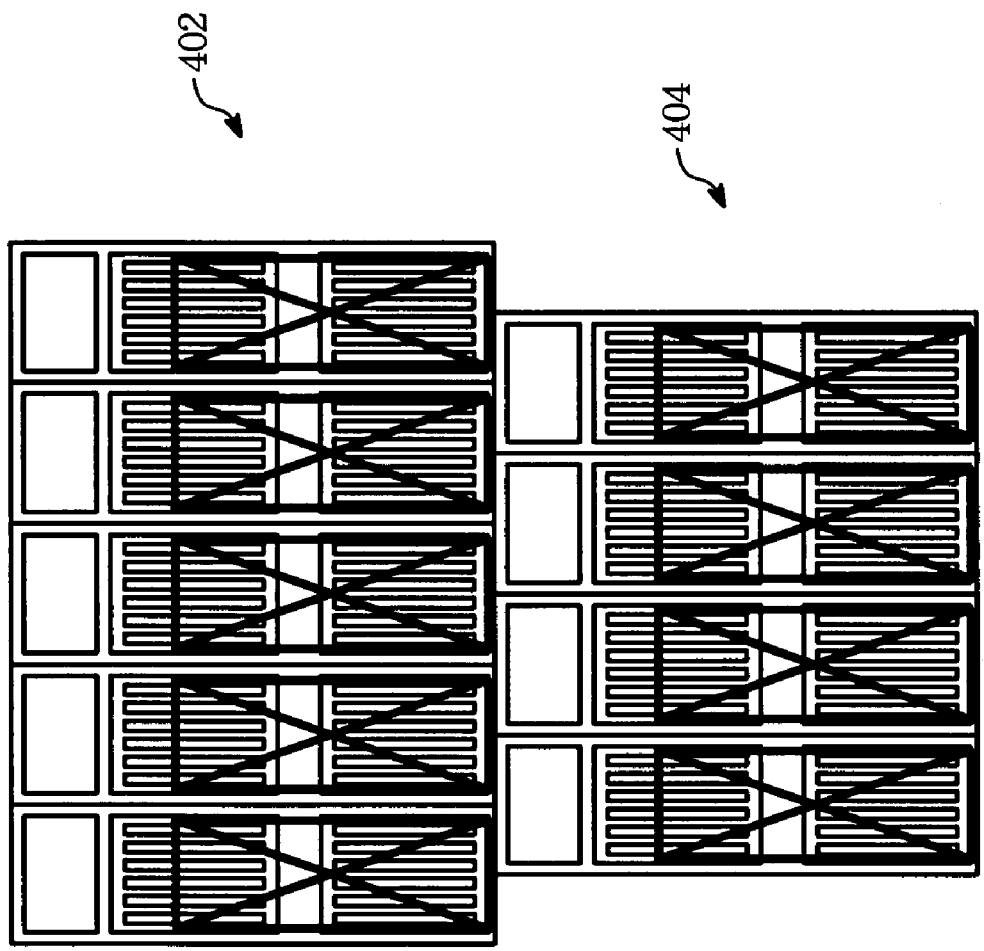
FIG. 4 illustrates another layout design of conventional I/O cells in a microchip.
Figure 6:
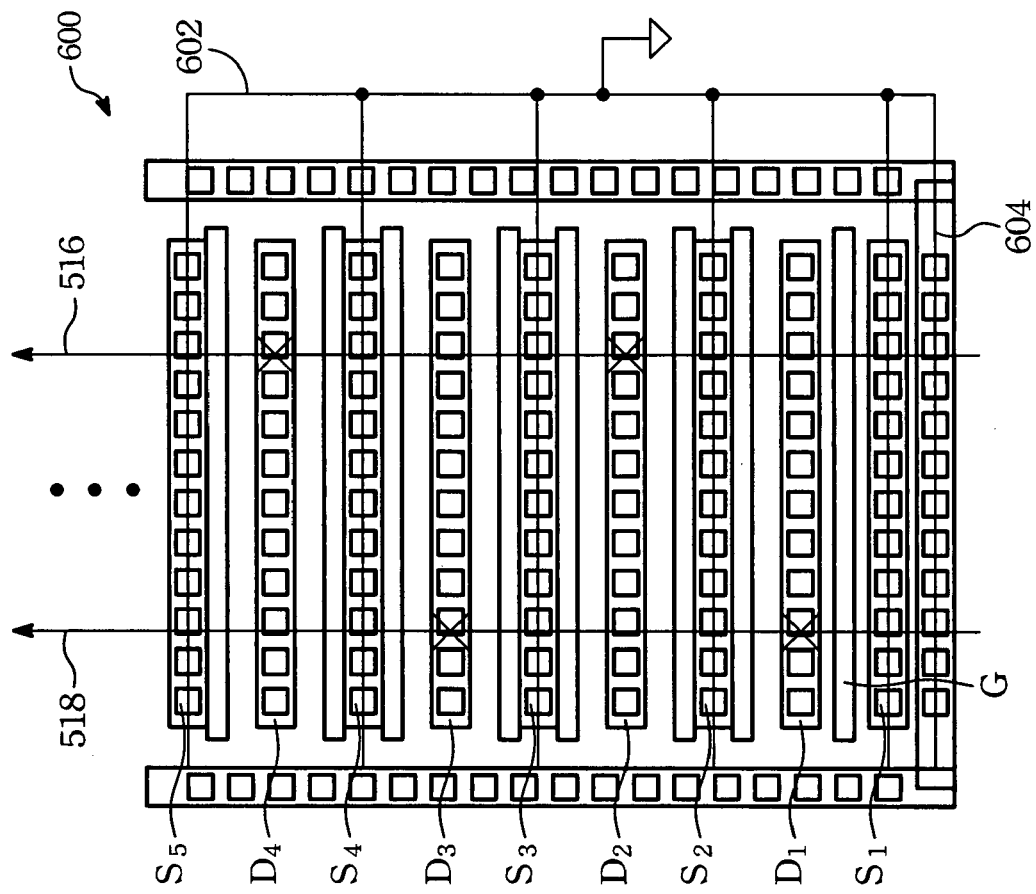
FIG. 6 partially illustrates an enlarged layout design of I/O cells in accordance with one embodiment of the present invention.

FIG. 6 partially illustrates an enlarged view 600 of the post-driver NMOS transistor area 508 shown in FIG. 5 in accordance with one embodiment of the present invention. A number of gate conductive lines G are constructed on a P-type substrate (no shown in the figure). A plurality of source doped regions S1, S2, S3, S4 and S5 are disposed adjacent to the gate conductive lines G on the P-type substrate. Similarly, a plurality of drain doped regions D1, D2, D3, D4 and D5 are disposed between two neighboring gate conductive lines G on the P-type substrate. Each combination of consecutive source doped region, gate conductive line and drain doped region constitutes an NMOS transistor, and each drain doped region is shared by two neighboring NMOS transistors. The first conductive line 516 disposed above the gate conductive layers G connects the drain doped regions D2 and D4 via drain contacts to the first I/O pad. The second conductive line 518 disposed above the gate conductive layers G connects the drain doped regions D1 and D3 via drain contacts to the second I/O pad. The drain doped regions D2 and D4 connected to the first conductive line 516 are interwoven with the drain doped regions D1 and D3 connected to the second conductive line 518, such that every two drain doped regions connected to the first conductive line 516 are separated by at least one drain doped region connected to the second conductive line 518.

A network of ground buses 602 disposed vertically between the gate conductive layer G and the conductive lines 516 and 518 are arranged along with the source doped regions S1, S2, S3, S4 and S5, for connecting the same to ground via source contacts. The post-driver NMOS transistor area is surrounded by electrostatic discharge (ESD) pick-up doped regions 604, which are shown at the bottom, left and right sides in the drawing, with the top side truncated. The ESD pick-up doped regions 604 are also connected to the ground bus network 602 via ESD pick-up contacts for switching the NMOS transistors implemented in the post-driver NMOS transistor area from a normal operation mode to an ESD protection mode. Details of such mode switching will be explained in detail below.

Figure 7:
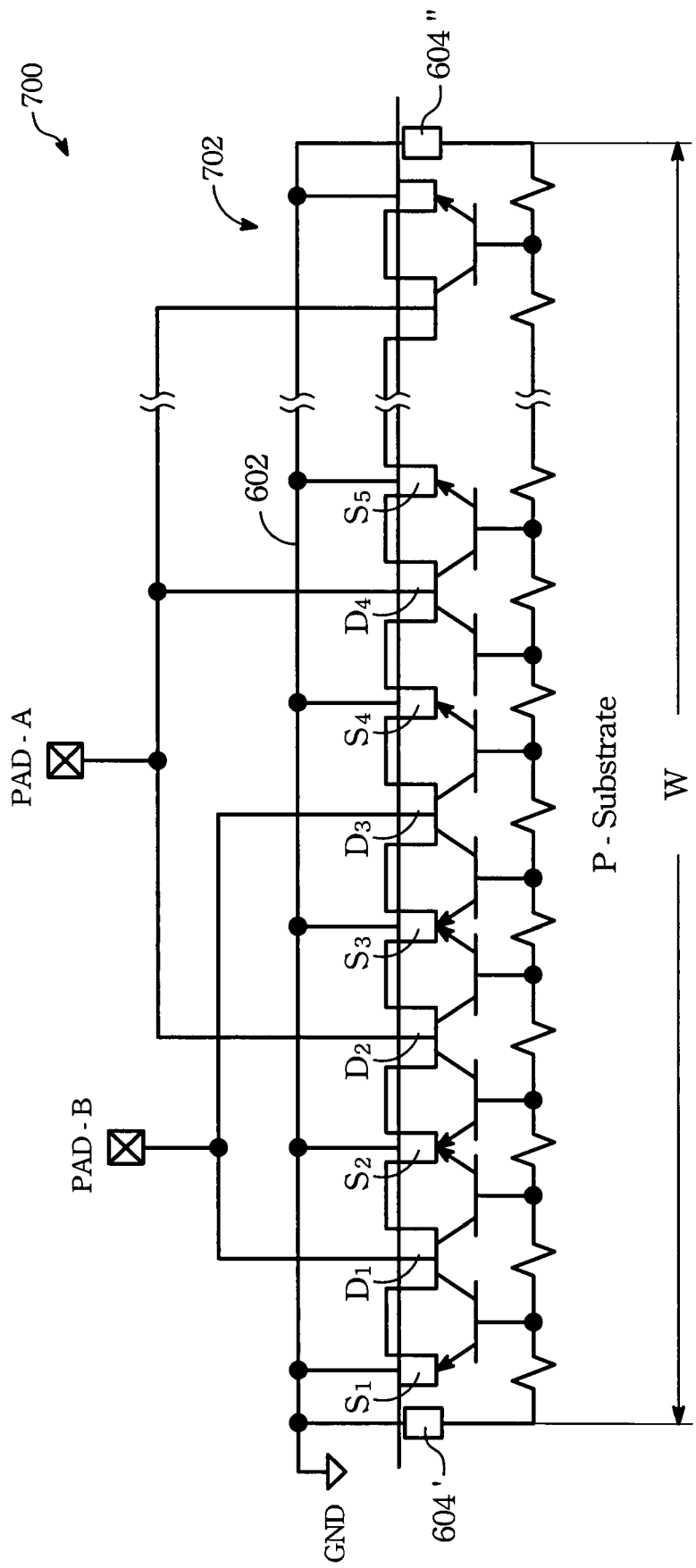
FIG. 7 illustrates a cross-sectional view of I/O cells in accordance with one embodiment of the present invention.

FIG. 7 illustrates a cross-sectional view 700 of the NMOS transistors implemented in the post-driver NMOS transistor area shown in FIG. 6. Source doped regions S1, S2, S3, S4 and S5 are connected to ground via the ground bus network 602. The drain doped regions D2 and D4 are connected to the first I/O pad PAD_A, and the drain doped regions D1 and D3 are connected to the second I/O pad PAD_B. The NMOS transistor 702 at the right to a truncation mark shows an end of this transistor chain. A first ESD pick-up doped region 604' is implemented at the left end of the post-driver NMOS transistor area, and a second ESD pick-up doped region 604" is implemented at the right end of the post-driver NMOS transistor area. The width W between the first and second ESD pick-up doped regions 604' and 604" is crucial for these NMOS transistors to function properly during an ESD event.

In normal operation, the NMOS transistors that share common drain doped regions D1 and D3 function in a way that allows signals from the second I/O pad PAD_B to be sent to core circuit devices (not shown in the figure). Similarly, the NMOS transistors that share common drain doped regions D2 and D4 function in a way that allows signals from the first I/O pad PAD_A to be sent to core circuit devices (not shown in the figure).

During an ESD event, ESD current are passed to the P-type substrate via the ESD pick-up doped regions 604' and 604" to the bases of parasitic bipolar transistors formed by the source doped regions, the drain doped regions and the P-type substrate. The ESD current triggers on the parasitic bipolar transistors, such that the ESD current can flow from the drain doped regions to the source doped regions and dissipate to ground.

In order for these NMOS transistors, collectively referred to as an ESD cluster, function properly (or effectively) during an ESD event, the width W between the first and second ESD pick-up doped regions 604' and 604" needs to be sufficiently long. If the width W is too short, there will not be sufficient substrate resistance, and therefore the ESD cluster will be easily triggered and interfere with proper functioning of core circuit devices. Generally, the width W cannot be shorter than 30 um in order for the ESD cluster to function properly.

In the embodiment of the invention, since one ESD cluster can be shared by more than one I/O cells, its width can be kept sufficiently long, while the I/O cells can be made narrower. For example, the width of the ESD cluster can be kept longer than 40 um, and the pitch of an I/O cell can be made as short as 20 nm, with two I/O cells sharing one common ESD clusters. As another example, the width of the ESD cluster can remain no less than 30 um, and the pitch of an I/O cell can be made as short as 15 nm, with two I/O cells sharing one common ESD cluster. As a result, the overall size of the I/O ring that is made up by I/O cells can be reduced as semiconductor processing technology advances.

It is understood by people skilled in the art that the principles of the proposed embodiment of the invention can also be applied to post-driver PMOS transistor areas. For example, the layout design 600 in FIG. 6 can be seen as the design for PMOS transistors, with the modification that the bus 602 is connected to a power supply instead of ground. It is also noted that the number of I/O cells that can share one common ESD cluster can be two or more. It is further noted that the gate conductive lines, the source doped regions and the drain doped regions can be arranged in parallel in a horizontal or vertical direction.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A microchip having at least one I/O area surrounding at least one core circuit area, the I/O area comprising:
   a first I/O cell having a first pre-driver device area and at least one post-driver NMOS transistor area connected to a first I/O pad;
   a second I/O cell disposed adjacent to the first I/O cell, the second I/O cell having a second pre-driver device area and the post-driver NMOS transistor area connected to a second I/O pad, wherein the first and second I/O cells share a plurality of NMOS transistors disposed on the post-driver NMOS transistor area, but have separate pre-driver device areas;
   a first conductive line overlying the first I/O cell for selectively connecting some of the NMOS transistors disposed on the post-driver NMOS transistor area to the first I/O pad;
   a second conductive line overlying the second I/O cell for selectively connecting the rest of the NMOS transistors disposed on the post-driver NMOS transistor area to the second I/O pad; and
   an electrostatic discharge (ESD) cluster shared by the first I/O cell and the second I/O cell for protecting the first and second I/O cells against ESD current during an ESD event, thereby reducing a total width of the first I/O cell and the second I/O cell.

2. The microchip of claim 1 wherein the post-driver NMOS transistor area includes a number of first conductive gate layers and a number of first source/drain doped regions adjacent to the first conductive gate layer on a P-type substrate.

3. The microchip of claim 2 wherein the post-driver NMOS transistor area includes a number of second conductive gate layers and a number of second source/drain doped regions adjacent to the second conductive gate layer on the P-type substrate.

4. The microchip of claim 3 wherein the first drain doped regions and the second drain doped regions are arranged in a way that every two first drain doped regions are separated by at least one of the second drain doped regions.

5. The microchip of claim 4 wherein the first and second conductive layers are substantially parallel to each other.

6. The microchip of claim 4, wherein the first conductive line is overlying the first and second gate conductive layers for connecting the first drain doped regions to the first I/O pad.

7. The microchip of claim 6, wherein the second conductive line is overlying the first and second gate conductive layers for connecting the second drain doped regions to the second I/O pad.

8. The microchip of claim 7 further comprising a ground bus underlying the first and second conductive lines for connecting the first and second source doped regions to ground.

9. The microchip of claim 7 further comprising a first set of ESD pick-up contacts and a second set of ESD pick-up contacts for connecting the substrate to the ground bus, and defining boundaries of the ESD cluster.

10. The microchip of claim 1 wherein the ESD cluster has a width no less than 30 um.

11. The microchip of claim 1 further comprises at least one post-driver PMOS transistor area constructed with a number of first conductive gate layers and a number of first source/drain doped regions adjacent to the first conductive gate layer.

12. The microchip of claim 11 wherein the at least one post-driver PMOS transistor area includes a number of second conductive gate layers and a number of second source/drain doped regions adjacent to the second conductive gate layer.

13. The microchip of claim 12 wherein the first drain doped regions and the second drain doped regions are arranged in a way that every two first drain doped regions are separated by at least one of the second drain doped regions.

14. The microchip of claim 13, wherein the first conductive line is overlying the first and second gate conductive layers for connecting the first drain doped regions to the first I/O pad.

15. The microchip of claim 14, wherein the second conductive line is overlying the first and second gate conductive layers for connecting the second drain doped regions to the second I/O pad.

16. The microchip of claim 15 further comprising a power bus underlying the first and second conductive lines for connecting the first and second source regions to a power supply.

17. A integrated circuit comprising:
   a core circuit area where a plurality of core devices are implemented;
   an I/O area surrounding the core circuit area, the I/O area further comprising:
   a first I/O cell having a first pre-driver device area and at least one post-driver NMOS transistor area constructed by a number of first conductive gate layers and a number of first source/drain doped regions adjacent to the first conductive gate layer, the first drain doped regions being connected to a first I/O pad via a first conductive line;
   a second I/O cell having a second pre-driver device area and the post-driver NMOS transistor area constructed by a number of second conductive gate layers and a number of second source/drain doped regions adjacent to the second conductive gate layer, the second doped regions being connected to a second I/O pad via a second conductive line, wherein the first and second I/O cells share a plurality of NMOS transistors disposed on the post-driver NMOS transistor area, but have separate pre-driver device areas;
   a first conductive line overlying the first I/O cell for selectively connecting some of the NMOS transistors disposed on the post-driver NMOS transistor area to the first I/O pad;
   a second conductive line over lying the second I/O cell for selectively connecting the rest of NMOS transistors disposed on the post-driver NMOS transistor area to the second I/O pad;
   an electrostatic discharge (ESD) cluster shared by the first I/O cell and the second I/O cell for protecting the first and second I/O cells against ESD current during an ESD event, thereby reducing a total width of the first I/O cell and the second I/O cell.

18. The microchip of claim 17 wherein the first drain doped regions and the second drain doped regions are arranged in a way that every two first drain doped regions are separated by at least one of the second drain doped regions.

19. The integrated circuit of claim 17 further comprising a first set of ESD pick-up contacts and a second set of ESD pick-up contacts for connecting a substrate to ground or a power bus.

20. The integrated circuit of claim 19 wherein the ESD cluster has a width no less than 30 um defined by the ESD pick-up contacts.

* * * * *